United States Patent
Park

(10) Patent No.: US 8,703,525 B2
(45) Date of Patent: Apr. 22, 2014

(54) SOLAR CELL AND MANUFACTURING METHOD THEREOF

(75) Inventor: Joong-Hyun Park, Suwon-si (KR)

(73) Assignees: Samsung SDI Co., Ltd., Yongin-si (KR); Samsung Display Co., Ltd., Yongin-si (KR)

( * ) Notice: Subject to any disclaimer, the term of this patent is extended or adjusted under 35 U.S.C. 154(b) by 403 days.

(21) Appl. No.: 12/793,281

(22) Filed: Jun. 3, 2010

(65) Prior Publication Data

US 2011/0067759 A1   Mar. 24, 2011

(30) Foreign Application Priority Data

Sep. 24, 2009   (KR) .................. 10-2009-0090709

(51) Int. Cl.
*H01L 31/00*   (2006.01)
*H01L 31/18*   (2006.01)

(52) U.S. Cl.
USPC ............. 438/88; 257/443; 257/466; 257/448; 257/431; 257/E31.11; 438/80; 438/98; 438/73; 438/57; 438/66

(58) Field of Classification Search
USPC .................... 257/443, 466, 448, 431, E31.11; 438/88, 80, 98, 73, 57, 66, 67
See application file for complete search history.

(56) References Cited

U.S. PATENT DOCUMENTS

| | | | |
|---|---|---|---|
| 5,626,686 A * | 5/1997 | Yoshida ........................ | 136/244 |
| 6,288,323 B1 | 9/2001 | Hayashi et al. | |
| 6,365,825 B1 * | 4/2002 | Hayashi et al. ................ | 136/243 |
| 6,455,347 B1 * | 9/2002 | Hiraishi et al. .................. | 438/80 |
| 6,632,993 B2 * | 10/2003 | Hayashi et al. ................ | 136/256 |
| 7,052,998 B2 * | 5/2006 | Shinohara ...................... | 438/702 |
| 2005/0076945 A1 * | 4/2005 | Tachibana et al. ............. | 136/244 |
| 2006/0196536 A1 * | 9/2006 | Fujioka et al. ................. | 136/244 |
| 2008/0026543 A1 * | 1/2008 | Miyairi et al. ................ | 438/455 |
| 2008/0289680 A1 * | 11/2008 | MacFarlane ................... | 136/246 |

FOREIGN PATENT DOCUMENTS

| | | |
|---|---|---|
| JP | 11191630 | 7/1999 |
| JP | 2001210851 | 8/2001 |
| JP | 2001267618 | 9/2001 |
| JP | 2002076401 | 3/2002 |
| JP | 2002076402 | 3/2002 |
| JP | 2006332190 | 12/2006 |
| JP | 4053193 | 12/2007 |
| KR | 1020090067351 | 6/2009 |

* cited by examiner

*Primary Examiner* — Lex Malsawma
*Assistant Examiner* — Sheng Zhu
(74) *Attorney, Agent, or Firm* — Christie, Parker & Hale, LLP

(57) ABSTRACT

A solar cell includes; a substrate; a first electrode disposed on the substrate, and including a first groove formed therein, a semiconductor layer disposed on the first electrode, and including a second groove formed therein, and a second electrode disposed on the semiconductor layer and connected to the first electrode via the second groove, wherein a third groove passing through the first electrode, the semiconductor layer, and the second electrode is formed in a first region, a fourth groove passing through only the semiconductor layer and the second electrode is formed in a second region, and the first region and the second region are alternately disposed along a direction of extension of the third groove.

10 Claims, 7 Drawing Sheets

SOLAR CELL AND MANUFACTURING METHOD THEREOF

This application claims priority to Korean Patent Application No. 10-2009-0090709, filed on Sep. 24, 2009, and all the benefits accruing therefrom under 35 U.S.C. §119, the content of which in its entirety is herein incorporated by reference.

BACKGROUND OF THE INVENTION (a) Field of the Invention

The present invention relates to a solar cell and a manufacturing method thereof.

(b) Description of the Related Art

A solar cell converts solar energy, or other types of electromagnetic radiation, to electrical energy. A solar cell is typically a diode formed of a PN junction, and the typical solar cell may be classified into various types according to a material used to form a light absorbing layer of the solar cell. A solar cell that uses silicon as a light absorbing layer may be classified as a crystalline substrate (wafer) type of solar cell or a thin film (crystalline, amorphous) type of solar cell. Also, a representative solar cell may be classified as a compound thin film solar cell using CuInGaSe2 ("CIGS") or CdTe, a group III-V solar cell, a dye response solar cell, and an organic solar cell.

The typical solar cell has a uniform open circuit voltage ("Voc") regardless of the size of the solar cell, such that a plurality of unit cells are patterned to be connected in series to each other to obtain a desired voltage when manufacturing the solar cell module. However, in this patterning process, layer damage may be generated or pattern deterioration may be generated due to the generation of a remaining layer on the side thereof such that photoelectric conversion efficiency of the solar cell may be reduced.

BRIEF SUMMARY OF THE INVENTION

The present invention prevents a reduction of efficiency of a solar cell due to remaining material generated in the patterning process.

An exemplary embodiment of a solar cell according to the present invention includes; a substrate; a first electrode disposed on the substrate and including a first groove formed therein, a semiconductor layer disposed on the first electrode and including a second groove formed therein; and a second electrode disposed on the semiconductor layer and connected to the first electrode via the second groove, wherein a third groove passing through the first electrode, the semiconductor layer and the second electrode is formed in a first region, a fourth groove passing through the semiconductor layer and the second electrode and extending to a boundary of the first electrode is formed in a second region, and the first region and the second region are alternately disposed along a direction of extension of the third groove.

In one exemplary embodiment, the third groove may be formed by irradiating the first electrode, the semiconductor layer and the second electrode with a laser through a mask.

In one exemplary embodiment, the laser may have a wavelength corresponding to an infrared ("IR") range.

In one exemplary embodiment, the fourth groove may be formed at a region overlapping the mask.

In one exemplary embodiment, the third groove is formed by irradiating the first electrode, the semiconductor layer and the second electrode with a first laser and the fourth groove may be formed by irradiating the laser, and the third groove and the fourth groove is formed by irradiating the second electrode and the semiconductor layer with a second laser having a different wavelength than the first laser.

In one exemplary embodiment, the first electrode may be made of at least one of SnO2 and ZnO:B.

In one exemplary embodiment, the first electrode may be made of SnO2, and the wavelength of a laser used when forming the third groove may be in a range of about 1060 nm to about 1064 nm.

In one exemplary embodiment, the width of the third groove may be larger than a width of the fourth groove.

In one exemplary embodiment, the first groove is formed by irradiating the first electrode with a laser and the third groove may be formed by irradiation of the first electrode, the semiconductor layer and the second electrode with the same laser, and the first groove and the third groove may be formed by the laser with the same wavelength.

In one exemplary embodiment, the semiconductor layer may include a P-type semiconductor layer, an I layer, and a N-type semiconductor layer sequentially deposited on the first electrode.

An exemplary embodiment of a method for manufacturing a solar cell according to the present invention includes; disposing a first electrode on a substrate, patterning the first electrode to form a first groove, disposing a semiconductor layer filling the first groove on the first electrode, patterning the semiconductor layer to form a second groove, disposing a second electrode filling the second groove on the semiconductor layer; patterning the first electrode, the semiconductor layer, and the second electrode to form a third groove; and patterning the semiconductor layer and the second electrode to form a fourth groove, wherein the third groove and the fourth groove are extended in substantially the same direction, and are alternately disposed.

In one exemplary embodiment, the formation of the third groove may include disposing at least one mask on the substrate, and irradiating the substrate with a laser using the mask to form the third groove at a first region, wherein the first region is not covered by the mask.

In one exemplary embodiment, the third groove may be formed using the laser having a wavelength that is reflected by the mask.

In one exemplary embodiment, the third groove may be formed using a laser having a wavelength within an IR range.

In one exemplary embodiment, the first electrode may be made of SnO2, and the third groove is formed using the laser having a wavelength of about 1060 nm to about 1064 nm range.

In one exemplary embodiment, the forming of the fourth groove may include removing the mask and forming the fourth groove in the second region that was previously covered by the mask.

In one exemplary embodiment, the width of the third groove may be larger than a width of the fourth groove due to the patterning.

In one exemplary embodiment, the third groove and the fourth groove may be formed using lasers with different wavelengths, respectively.

In one exemplary embodiment, the method may further include respectively contacting a probe with an upper surface of the second electrode of the different unit cells adjacent to the fourth groove, and applying a reverse bias voltage to a shorting portion including a remaining material generated when forming the fourth groove.

According to the present invention, a region having a high possibility that a leakage current will be generated is reduced such that the efficiency of the solar cell may be increased.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION OF THE INVENTION

Figure 1:
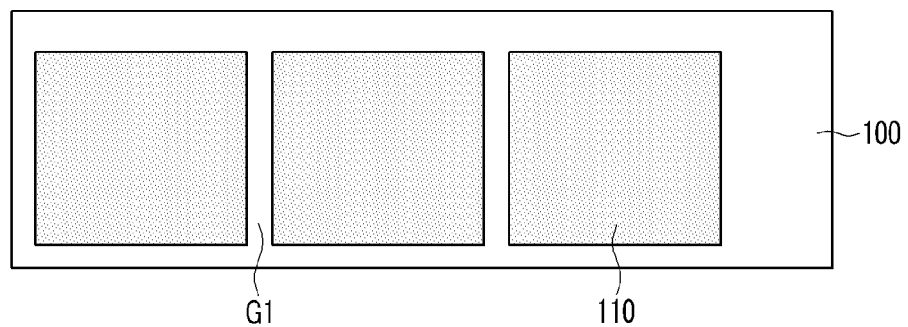
FIG. 1 to FIG. 5 are top plan views showing an exemplary embodiment of a method of manufacturing an exemplary embodiment of a solar cell according to the present invention.

The present invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 3:
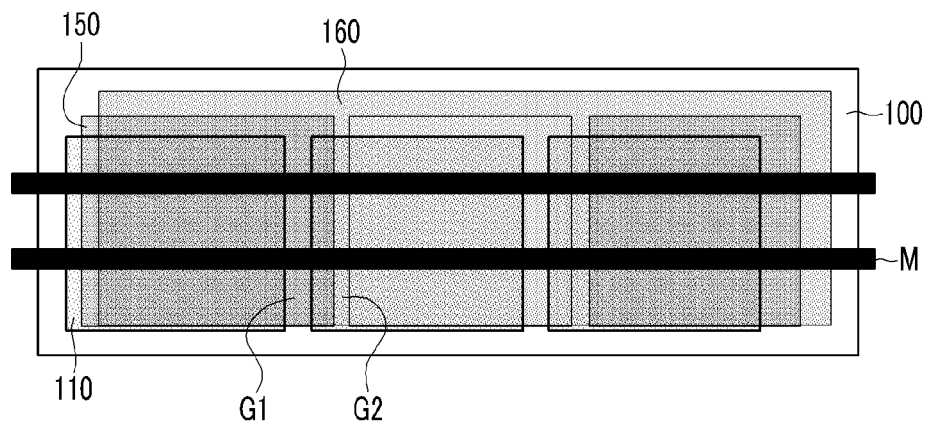
Figure 4:
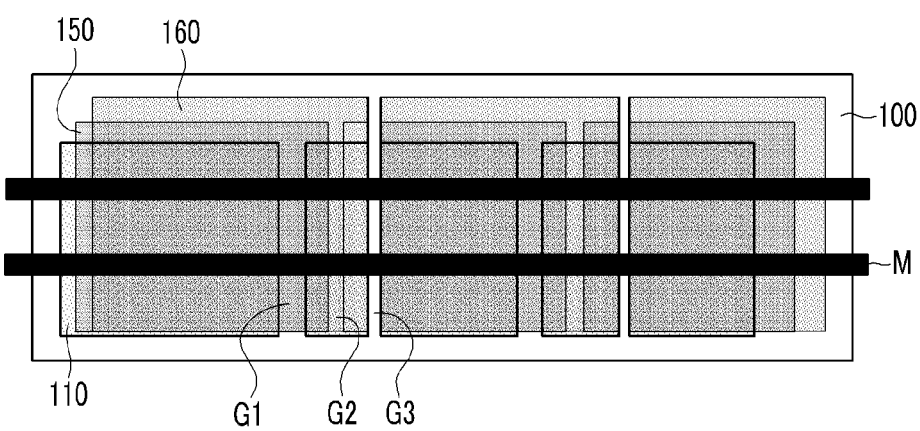
Figure 5:
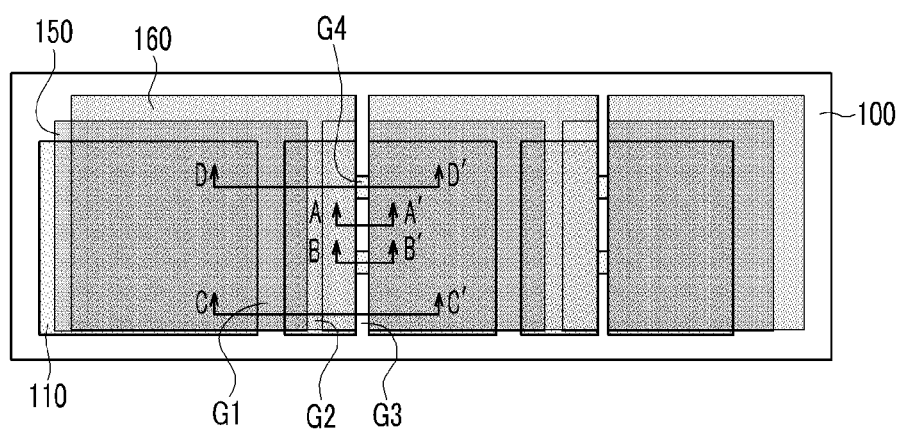
Figure 7:
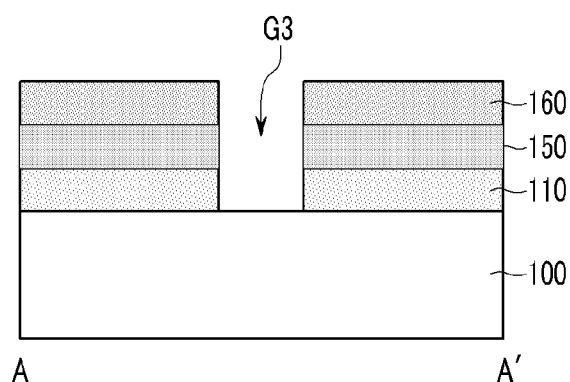
FIG. 7 is a cross-sectional view taken along line A-A' of FIG. 5.
Figure 8:
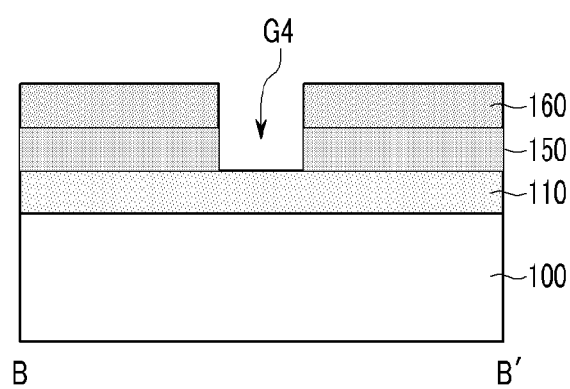
FIG. 8 is a cross-sectional view taken along line B-B' of FIG. 5.
Figure 9:
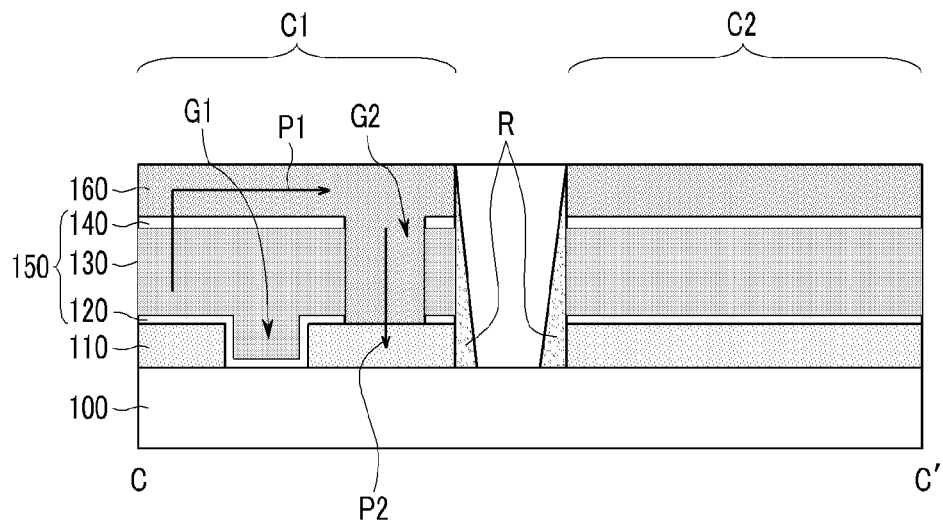
FIG. 9 is a cross-sectional view taken along line C-C' of FIG. 5.
Figure 10:
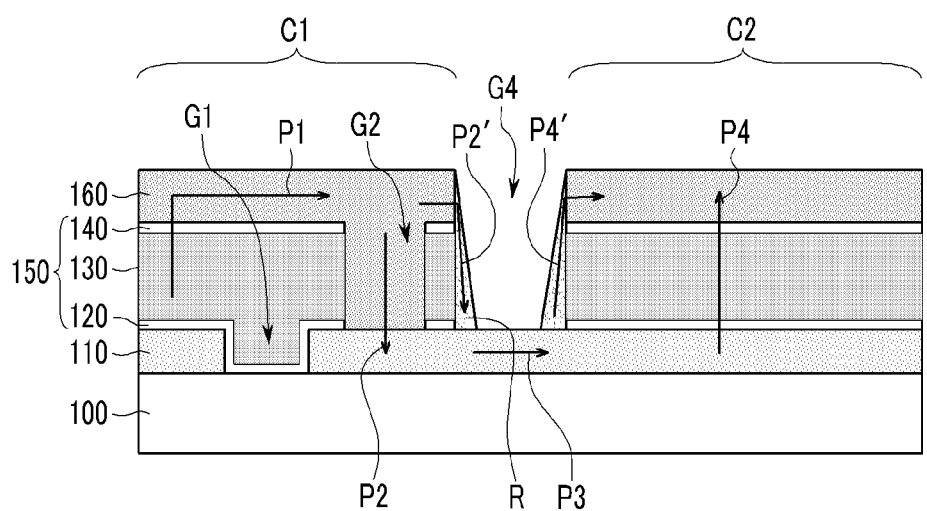
FIG. 10 is a cross-sectional view taken along line D-D' of FIG. 5.

FIG. 1 to FIG. 5 are top plan views showing an exemplary embodiment of a method of manufacturing an exemplary embodiment of a solar cell according to the present invention. FIG. 7 is a cross-sectional view taken along line A-A' of FIG. 5, FIG. 8 is a cross-sectional view taken along line B-B' of FIG. 5, FIG. 9 is a cross-sectional view taken along line C-C' of FIG. 5, and FIG. 10 is a cross-sectional view taken along line D-D' of FIG. 5.

A thin film solar cell may be made by connecting an upper electrode of one unit cell and a lower electrode of a neighboring unit cell, wherein the unit cells each include a PN junction made of a P-type semiconductor and an N-type semiconductor disposed between an upper electrode and a lower electrode.

In one exemplary embodiment, the upper electrode and the lower electrode may be connected to each other through several patterning processes.

Referring to FIG. 1, a first electrode 110 is formed on a substrate 100, exemplary embodiments of which may be made of glass or plastic by sputtering. Embodiments of the first electrode 110 may be made of $SnO_2$, ZnO:Al, ZnO:B, indium tin oxide ("ITO"), indium zinc oxide ("ITO") or other materials having similar characteristics. Next, the first electrode 110 is patterned, e.g., through laser scribing or mechanical scribing, to form a first groove G1. The following disclosure concentrates on embodiments wherein the patterning is performed via the laser scribing utilizing a laser.

Figure 2:
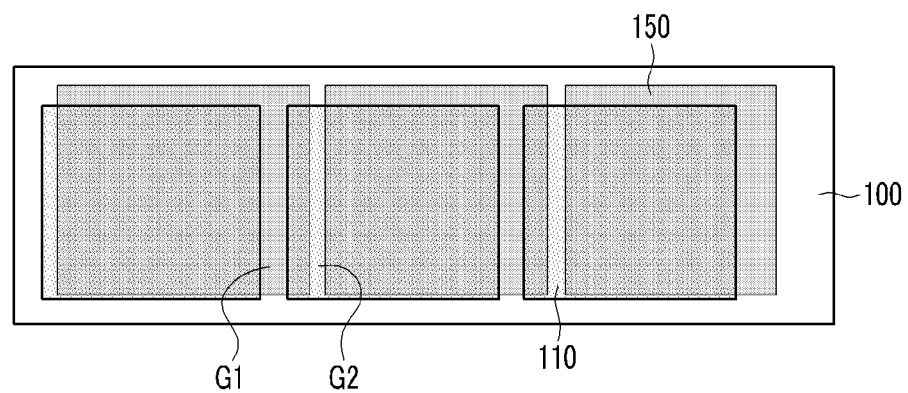

Referring to FIG. 2, a semiconductor layer 150 is formed on the first electrode 110 and fills the first groove G1. Next, the semiconductor layer 150 is patterned, e.g., through the laser scribing or mechanical scribing, to form the second groove G2. The following disclosure concentrates on embodiments wherein the patterning is performed via the laser scribing utilizing a laser.

Referring to FIG. 3, a second electrode 160 is formed on the semiconductor layer 150 and fills the second groove G2. Next, at least one metal wire M is disposed in a direction oblique to the first groove G1 and the second groove G2; in one exemplary embodiment the metal wire M may be disposed substantially perpendicular to the first groove G1 and the second groove G2. Exemplary embodiments include configurations wherein the metal wire M may be opaque, and may reflect a laser used in the laser scribing, wherein the laser has a wavelength in a range of about 355 nm to about 1064 nm. Alternative exemplary embodiments include configurations wherein a ceramic which reflects the laser may be used instead of the metal wire.

In an exemplary embodiment wherein the first electrode 110 is formed of SnO2, the wavelength of the laser may be in the infrared ("IR") range. Particularly, in one exemplary embodiment the laser having a wavelength in the range of about 1060 nm to about 1064 nm may be used to result in particularly good processing characteristics.

In an exemplary embodiment wherein the first electrode 110 is formed of ZnO2:B, the wavelength of the laser may be in the range of about 355 nm to about 532 nm. Particularly, in one exemplary embodiment the laser having a wavelength of about 355 nm may be used to result in particularly good processing characteristics.

Figure 12:
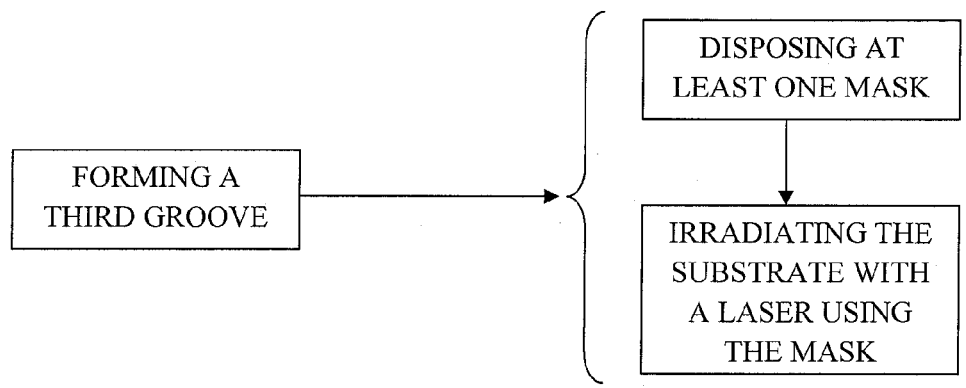
FIG. 12 is a method of forming a third groove in a solar cell according to an embodiment.

Referring to FIG. 4 and FIG. 12, the third groove G3 is formed in a direction substantially oblique to the metal wire M; in one exemplary embodiment the third groove G3 extends in a direction substantially perpendicular to the metal wire M. Here, the metal wire M functions as a mask such that the third groove G3 may be formed at a first region that is not covered by the metal wire M. In one exemplary embodiment, the third groove G3 may be formed using an IR laser. In one exemplary embodiment, the third groove G3 may be formed using a laser having a same wavelength as a wavelength of a laser used to form the first groove G1.

The third groove G3 passes through, e.g., is formed through, the first electrode 110, the semiconductor layer 150, and the second electrode 160 such that none of the first electrode 110, the semiconductor layer 150, and the second electrode 160 extends across the groove G3.

Referring to FIG. 5, FIG. 7, and FIG. 8, after removing the metal wire M, the fourth groove G4 passing through the semiconductor layer 150 and the second electrode 160 is formed in a second region that was covered by the metal wire M. In one exemplary embodiment, the fourth groove G4 may be formed by using a second harmonic generation ("SHG") laser. The SHG laser removes portions of the first electrode 110 on the substrate 100 that are not covered by the metal wire M, however in regions where the metal wire M is disposed, the SHG laser may selectively pattern only the semiconductor layer 150 and the second electrode 160 while leaving the first electrode 110 intact. Specifically, in the present exemplary embodiment, the fourth groove G4 is formed locally only within the third groove G3 and only on portions within the third groove G3 that were covered by the metal wire M.

The third groove G3 and the fourth groove G4 may be extended in the same direction, and may be alternatively arranged.

Characteristics according to an exemplary embodiment of the present invention will be described with reference to FIG. 9 and FIG. 10.

Referring to FIG. 9, in one exemplary embodiment the semiconductor layer 150 may be formed by sequentially depositing a P-type semiconducting layer (hereinafter referred to as a "P layer") 120 having a P-type impurity, an I layer 130 made of an intrinsic semiconductor material, and a N-type semiconducting layer (hereinafter referred to as an "N layer") 140 having an N-type impurity on the first electrode 110.

A conductive remaining material R generated in the patterning process may remain on the sidewall of the semiconductor layer 150 that is exposed through the third groove G3. The remaining material R is conductive, and if it were to contact adjacent unit cells, e.g., first unit cell C1 and second unit cell C2, it could provide a pathway for a leakage current to flow therealong. However, the third groove G3 according to an exemplary embodiment of the present invention passes through the first electrode 110 as well as the semiconductor layer 150 and the second electrode 160. That is, the first electrode 110 that is connected to the conductive remaining material R is removed along much of the third groove G3 such that the region consisting the path of the leakage current may be reduced, e.g., if the first electrode 110 were present throughout the groove G3, the leakage current could flow from the semiconductor layer 150 of the first unit cell C1 to the second unit cell C2 along the first electrode 110, but because the first electrode 110 has been removed over a majority of this area, the pathway for leakage current has been substantially reduced.

Referring to FIG. 10, in the area where the first electrode 110 remains and the semiconductor layer 150 and the second electrode 160 are patterned using the SHG laser, the conductive remaining material R may be generated on the sidewall of the semiconductor layer 150 that is exposed by the fourth groove G4. The conductive remaining material R is connected to the first electrode 110 such that a leakage path with current flowing along P1→P2'→P3→P4' may be formed. If the current flows according to the leakage path, the light efficiency may be decreased compared with the normal current path P1→P2→P3→P4.

However, according to an exemplary embodiment of the present invention, it is the portion of the solar cell corresponding to the fourth groove G4 only which may cause the leakage current, as opposed to the entire area corresponding to the third groove G3 such that the light efficiency of the resulting solar cell may be increased. Also, exemplary embodiments of the conductive remaining material R formed at the fourth groove G4 may be oxidized or removed by applying a reverse bias voltage after contacting a probe T, illustrated in more detail with respect to FIG. 11, with the upper surface of the first unit cell C1 and the second unit cell C2 adjacent to the fourth groove G4.

Figure 6:
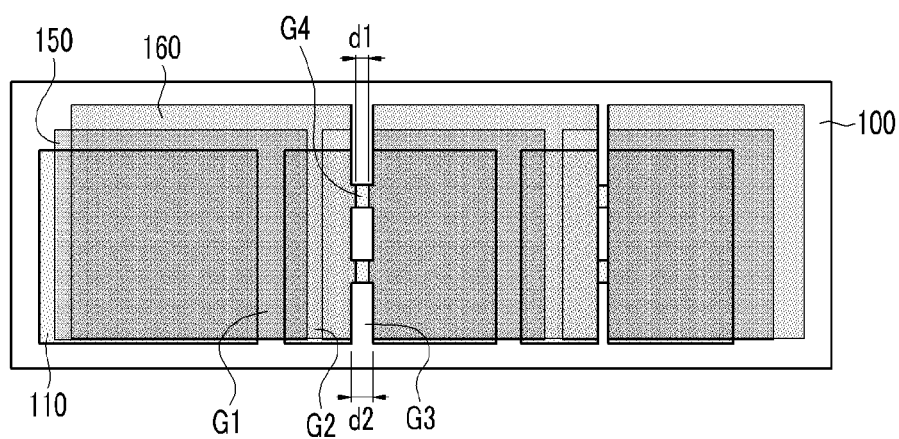
FIG. 6 is a top plan view showing another exemplary embodiment of a method of manufacturing an exemplary embodiment of a solar cell according to the present invention.

FIG. 6 is a top plan view showing another exemplary embodiment of a method of manufacturing an exemplary embodiment of a solar cell according to the present invention.

An exemplary embodiment shown in FIG. 6 is substantially similar to the exemplary embodiment shown in FIG. 5. However, the width d2 of the third groove G3 may be larger than the width d1 of the fourth groove G4. The width d2 of the third groove G3 may be made relatively larger by increasing the energy of the IR laser to reduce the possibility of generating the leakage current. Exemplary embodiments of the width d2 of the third groove G3 may be in the range of about 75 um to about 95 um. Exemplary embodiments of the width d2 of the third groove G3 and the width d1 of the fourth groove G4 may be changed according to the laser processing device, and in an exemplary embodiment wherein the width d2 of the third groove G3 is in the range of about 75 um to about 95 um, the width d1 of the fourth groove G4 may be in the range of about 55 um to about 75 um.

Figure 11:
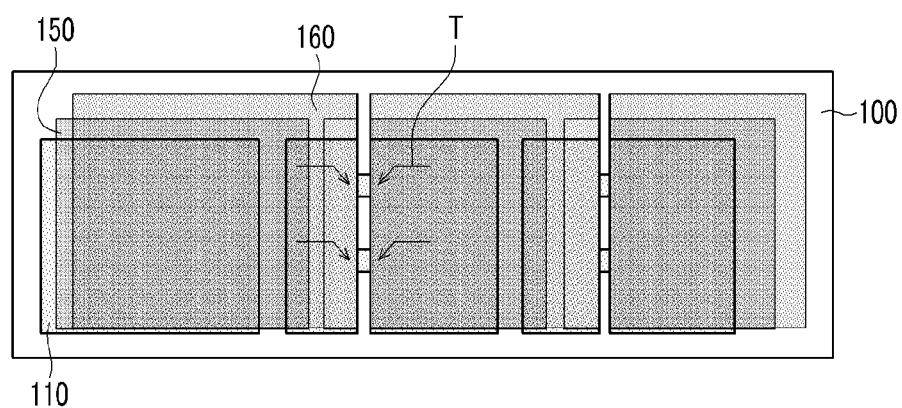
FIG. 11 is a top plan view showing another exemplary embodiment of a method of manufacturing a solar cell according to the present invention.

FIG. 11 is a top plan view showing another exemplary embodiment of a manufacturing method of another exemplary embodiment of a solar cell according to the present invention.

Referring to FIG. 11, the probe T is contacted with the upper surface of the first unit cell C1 and the second unit cell C2 adjacent to the fourth groove G4 which may generate the leakage current therealong, and then the reverse bias voltage may be applied.

When the reverse bias voltage is applied through the probe T, a shorting portion that is formed by the remaining material R generated when forming the fourth groove G4 may be oxidized or removed. The probe T may contact the unit solar cells only at the positions having the high possibility of generating the leakage current, the number of probes may be reduced, thereby simplifying the configuration, and a breakdown may be prevented at the normal element part.

A structure of an exemplary embodiment of a solar cell according to the present invention will now be described with reference to FIG. 5, FIG. 9, and FIG. 10.

Referring to FIG. 5, FIG. 9 and FIG. 10, an exemplary embodiment of a solar cell according to the present invention includes the first electrode 110 deposited on the substrate 100. The first electrode 110 functions as the lower electrode, and may be made of $SnO_2$, ZnO:Al, ZnO:B, ITO, IZO or other materials having similar characteristics as describe above.

The P layer 120 having the P-type impurity, the I layer 130 made of the intrinsic semiconductor, and the N layer 140 having the N-type impurity are sequentially deposited on the first electrode 110. The I layer 130 functions as a light absorption layer, and is a path for moving charge carriers from the P layer 120 to the N layer 140 by generating the electric field. That is, among the charge carriers generated in the light absorbing layer by the sunlight, the electrons are collected at the N layer 140 and the holes at the P layer 120 by way of drift of the internal electric field, thereby generating electrical currents.

Exemplary embodiments of the P layer 120 may be formed from one of boron doped amorphous silicon (a-Si:H), amorphous silicon carbide (a-SiC:H) or other materials with similar characteristics. In one exemplary embodiment, the I layer 130 and the N layer 140, which are light absorbing layers, may be formed from amorphous silicon (a-Si:H).

The first groove G1 passing through the first electrode 110, and the second groove G2 passing through the semiconductor layer 150 and substantially parallel to the direction that the first groove G1 is extended, are then formed.

The third groove G3 and the fourth groove G4 are formed in substantially the same direction as the direction that the first groove G1 and the second groove G2 are extended. The third groove G3 passes through the first electrode 110, the semiconductor layer 150, and the second electrode 160, and the fourth groove G4 passes through only the semiconductor layer 150 and the second electrode 160, but not the first electrode 110. The third groove G3 and the fourth groove G4 are alternately positioned along the direction of extension of the third groove G3. The electron movement between the neighboring unit cells C1 and C2 is generated through the first electrode 110 disposed under the fourth groove G4 shown in FIG. 10.

The first groove G1 has the function of insulating the first electrode 110, and the second groove G2 has the function of electrically connecting the first electrode 110 and the second electrode 200 respectively corresponding to the upper electrode and the lower electrode. Also, the third groove G3 and the fourth groove G4 has the function of insulating the neighboring unit cells in the solar cell including a plurality of unit cells C1, C2, ..., etc.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a solar cell, comprising:
disposing a first electrode on a substrate;
patterning the first electrode to form a first groove;
disposing a semiconductor layer filling the first groove on the first electrode;
patterning the semiconductor layer to form a second groove;
disposing a second electrode filling the second groove on the semiconductor layer;
patterning the first electrode, the semiconductor layer and the second electrode to form a third groove; and
patterning the semiconductor layer and the second electrode to form a fourth groove,
wherein the third groove and the fourth groove are alternately arranged along a line that is substantially parallel to the first and second grooves wherein, in a direction perpendicular to the line, the width of the third groove and the fourth groove is less than the width of the first electrode; and
wherein, along the line that is substantially parallel to the first and second grooves, a length of the third groove is greater than a length of the fourth groove.

2. The method of claim 1, wherein the formation of the third groove comprises:
disposing at least one mask on the substrate; and
irradiating the substrate with a laser using the mask to form a third groove at a first region,
wherein the first region is not covered by the mask.

3. The method of claim 2, wherein the third groove is formed using the laser having a wavelength that is reflected by the mask.

4. The method of claim 3, wherein the third groove is formed using the laser having a wavelength within an infrared range.

5. The method of claim 4, wherein the first electrode is made of SnO2, and the third groove is formed using the laser having a wavelength of about 1060 nm to about 1064 nm.

6. The method of claim 5, wherein the forming of the fourth groove comprises:
removing the mask; and
forming a fourth groove in a second region that was previously covered by the mask.

7. The method of claim 2, wherein the at least one mask is disposed on a lower surface of the substrate, and the irradiating of the substrate includes irradiating the substrate from the lower surface thereof with the laser.

8. The method of claim 1, wherein a width of the third groove is larger than a width of the fourth groove due to the patterning.

9. The method of claim 8, wherein the third groove and the fourth groove are formed using lasers with different wavelengths, respectively.

10. The method of claim 1, further comprising:
respectively contacting a probe with an upper surface of the second electrode of different unit cells adjacent to the fourth groove; and
applying a reverse bias voltage to a shorting portion including a remaining material generated when forming the fourth groove.

* * * * *